United States Patent [19]
Moroo

[11] Patent Number: 5,768,198
[45] Date of Patent: Jun. 16, 1998

[54] SEMICONDUCTOR MEMORY HAVING REDUNDANCY FUNCTION IN BLOCK WRITE OPERATION

[75] Inventor: Chisa Moroo, Tokyo, Japan

[73] Assignee: NEC Corporation, Tokyo, Japan

[21] Appl. No.: 892,029

[22] Filed: Jul. 14, 1997

[30] Foreign Application Priority Data

Jul. 15, 1996 [JP] Japan .................. 8-185036

[51] Int. Cl.⁶ .................................. G11C 7/00
[52] U.S. Cl. .................. 365/200; 365/225.7; 365/230.03
[58] Field of Search .................. 365/200, 225.7, 365/203, 203.03

[56] References Cited

U.S. PATENT DOCUMENTS 5,319,606  6/1994  Bowden et al. .................. 365/230.06
5,590,085  12/1996  Yuh et al. .................. 365/200
5,657,279  8/1997  Savignac et al. .................. 365/200
5,699,306  12/1997  Lee et al. .................. 365/200

Primary Examiner—David C. Nelms
Assistant Examiner—Vu A. Le
Attorney, Agent, or Firm—Sughrue, Mion, Zinn, Macpeak & Seas PLLC

[57] ABSTRACT

A redundancy check circuit is composed of the fuses corresponding to more significant column addresses and the fuses corresponding, for the ordinary write operation, to lesser significant column and also corresponding, for the block write operation, to the column mask signal. Thereby, during the block write operation, the lesser significant column addresses are invalidated and the redundancy signal can be outputted depending on the redundancy check result and the column mask check result of more significant addresses.

3 Claims, 2 Drawing Sheets

SEMICONDUCTOR MEMORY HAVING REDUNDANCY FUNCTION IN BLOCK WRITE OPERATION

BACKGROUND OF THE INVENTION

The present invention relates to a semiconductor memory and, more particularly to an improvement in redundancy circuit of a semiconductor memory having a function of simultaneously and selectively writing data into a plurality of column addresses.

The so-called block write operation or function has been proposed and put into practical use as a high speed processing method for a desired area on a memory cell array. Such operation is often required for a memory that is used as a video memory. The block write function is activated to simultaneously select a plurality of columns and then write data thereinto by invalidating less significant bits of address information.

In this case, if a fault is detected in the column addresses selected simultaneously, such defective column address is replaced with a redundancy address. This redundancy check is executed in a redundancy check circuit. Usually, the redundancy check circuit is formed of a fuse and a logic circuit.

The above function is also called as a column mask function in which a write operation is performed on each column of a plurality of columns which are simultaneously selected for execution of data writing in the block write cycle.

The column mask function is effective to assign a column mask signal to each of a plurality of columns to write the data, when the assigned column mask signal is in the "L" level, to the corresponding column, but not to write the data, when the assigned column mask signal is in the "H" level, to the corresponding column. Therefore, when the column mask function is activated to the column address which is replaced with the redundancy address, data writing should not be executed. In the memory having the block write function, as explained above, a plurality of column addresses are selected simultaneously. Accordingly, if only one column address among those selected is defective, redundancy replacement must be executed to such defective address. Moreover, when the column mask function is executed to such defective address, the redundancy YSW is closed to execute control not to implement the data writing operation. Therefore, an exclusive fuse for checking implementation of the column mask function corresponding to the defective column address is required.

Referring now to FIG. 2, the redundancy check circuit according to prior art includes three areas I, II and III. The area III is a usual redundancy check circuit and the area I is a redundancy check circuit for less significant bits of address information, which are invalidated during the block write operation. The area II is a redundancy check circuit only for block write added for column mask check during the block write operation.

A node 1 indicates a redundancy signal which becomes "H" level during redundancy. Although not indicated in the figure, when the node 1 is in the "H" state, the usual column is not selected and the redundancy column is selected.

Before the redundancy check is executed, a precharge signal (in the "L" level before the redundancy check is executed) is inputted to the gates of the P-channel transistors Tr40 and Tr41 in order to precharge the nodes 1 and 2 up to the "H" level.

AiT, AiN (i=0 to 7) are column address signals where AiT is the positive logic or true level signal, while AiN is the negative logic or complementary level signal. The transistor to which the column address signal is inputted to the gate is connected to GND at one terminal and to the node 1 via an associated one of fuses 10 to 25 at the other terminal, respectively.

Moreover, CMi (i=0 to 7) is a column mask signal which controls that data is written into the designated column address when it is "L" level and that data is not written to the designated column address when it is "H" level. Namely, the signals CMi (i=0 to 7) executes mask controls sequentially to eight columns in such a manner that CM0 executes the mask control for the least significant column address of eight columns and CM1 executes the mask control for the next column.

The transistor to which CMi (i=0 to 7) is inputted to the gate is connected at one terminal to GND and to the contact 2 via the fuses 30 to 37 (exclusive fuses for block write) at the other terminal. Moreover, the NOR (N100) output of the block write control signal ("H" level during the block write operation) and an output of the contact 2 is inputted to the gate of the N-channel transistor (Tr8) connecting the contact 1 and GND.

When block write operation is not carried out, since the block write control signal is in the "L" level, the NOR output of N100 is fixed to the "L" level via the inverter N30, Tr8 turns OFF, the area II is invalidated and the area III is validated. The area III cuts the fuse corresponding to the redundancy address.

The node, which performs ordinary redundancy check operation on the column address including the less significant bits (AiT, AiN: i=0, 1, 2) and is precharged to the "H" level, is discharged to the "L" level when any one of the transistors connected to the fuses which not blown, thereby, not selecting the redundancy YSW. On the contrary, only when all transistors connected to the fuses not turned OFF are completely turned OFF, the potential of the contact 1 is held at the "H" level to select the redundancy YSW. During the block writing operation, eight columns in which the column addresses of more significant bits are used in common are selected simultaneously by neglecting the column addresses of less significant three bits. Therefore, during the block write operation, the column address signals AiT, AiN (i=0, 1, 2) are fixed to the "L" level and information of the fuse of area I is invalidated and the area II is in turn validated. The fuses 30 to 37 of the area II are cut off, leaving only the part corresponding to the redundancy addresses.

Here, it is assumed that the fuses 31 to 37, for example, corresponding to the other CM1 to CM7 are all cut off, leaving only the fuse 30 corresponding to CM0. In the redundancy check of the more significant bits (AiT, AiN: i=3 to 7), only when the contact 1 is in the "H" level (namely, all transistors for which the fuses are not cut off in the area III are all OFF), the column mask function is not activated and CM0 allows data writing (in the "L" level), the contact 2 is kept at the "H" level and Tr8 turns OFF when the NOR output of N100 is in the "L" level. Therefore the contact 1 is in the "H" level and the redundancy YSW is selected to execute the write operation. In addition, when the column mask function is effectuated and CM0 does not allow write operation (in the "H" level), the contact 2 is turned to the "L" level by the Tr30 of the N-channel transistors Tr30 to Tr37. Thereby, the NOR output of N100 is turned to the "H" level and Tr8 turns ON, followed by that the contact 1 is set to the "L" level, not executing the write operation to the redundancy column.

Since the memory having the block write function is also provided with the column mask function, the column mask check result must be fetched in place of less significant addresses for the redundancy check of the column addresses during the block write operation. Therefore, the redundancy check circuit formed of the exclusive fuse and logic circuit corresponding to the column mask check result is required.

Even when the logic circuit may be fabricated in ultra-miniaturized size, a fuse cannot be reduced in size because it requires the cutting by laser. Therefore, increase of exclusive fuse corresponding to column mask check gives larger influence on the chip area, allowing increase of chip surface area.

SUMMARY OF THE INVENTION

It is therefore an object of the present invention to provide a semiconductor memory which can eliminate increase in number of fuses through common use with the fuses and transistors corresponding to the less significant column addresses which is invalidated during the block write operation.

According to the present invention, there is provided a semiconductor memory, which has a first mode in which data is written into a column address and a second mode in which data are written into column address and a means to simultaneously select a selected ones of a plurality of column addresses by invalidating a part of bits of column address information and using column mask information, including a redundancy check circuit uses in common to a fuse circuit corresponding to the column address signal which is invalidated during the write operation to a plurality of columns and the fuse circuit corresponding to the column mask signal for controlling the mask function by fetching, during the write operation for single column, the column address signal which is invalidated during the write operation to a plurality of columns and fetching, during the write operation for a plurality of columns, the column mask signal for controlling the mask function.

The above and other objects, advantages and features of the present invention will be more apparent from the following description taken in conjunction with the accompanying drawings, in which:

FIG. 1 is a circuit diagram of a redundancy check circuit of a semiconductor memory according to an embodiment of the present invention; and FIG. 2 is a circuit diagram of a redundancy check circuit according to the prior art.

DETAILED DESCRIPTION OF THE PREFERRED EMBODIMENT

Figure 1:
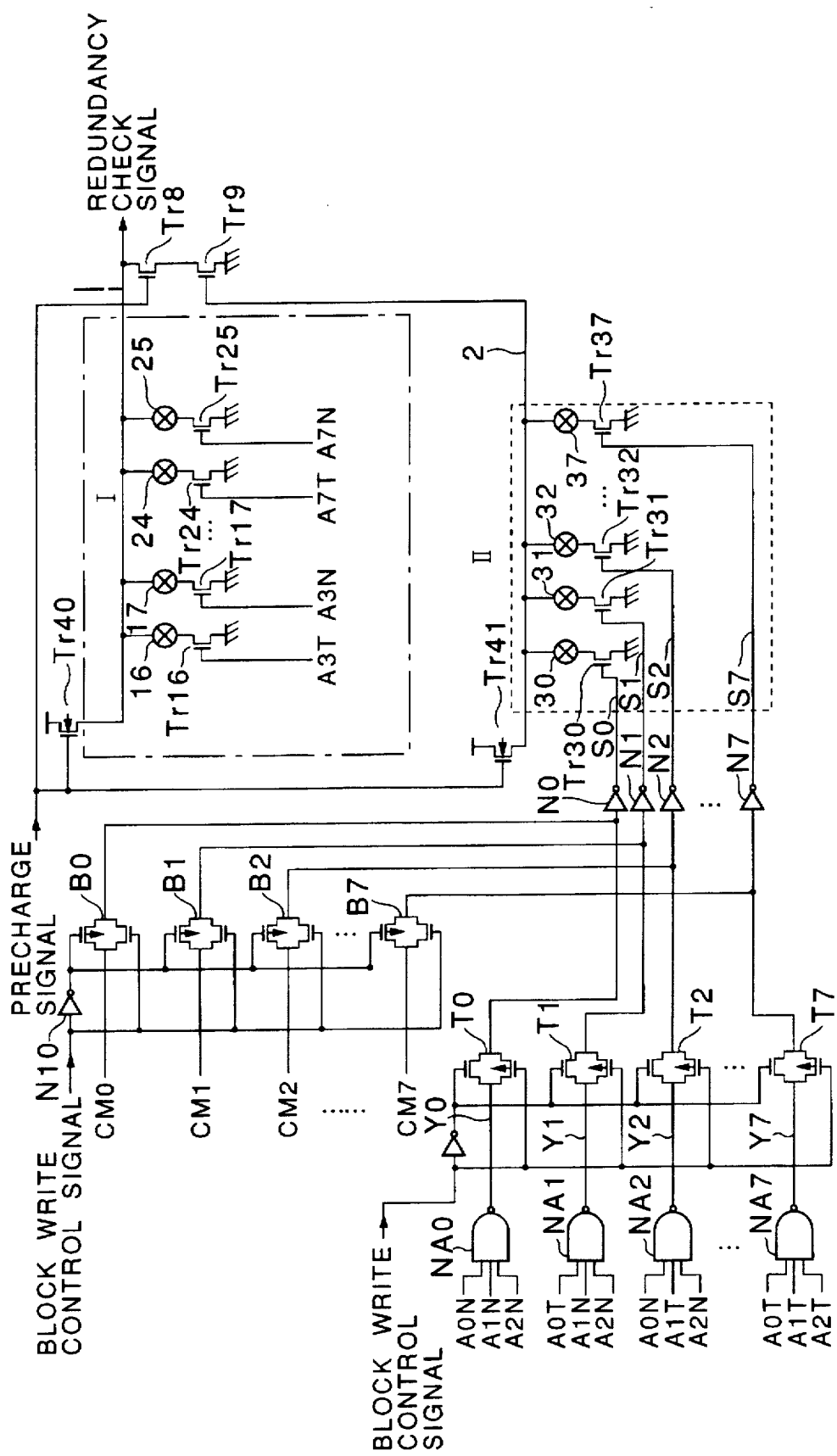
Figure 2:
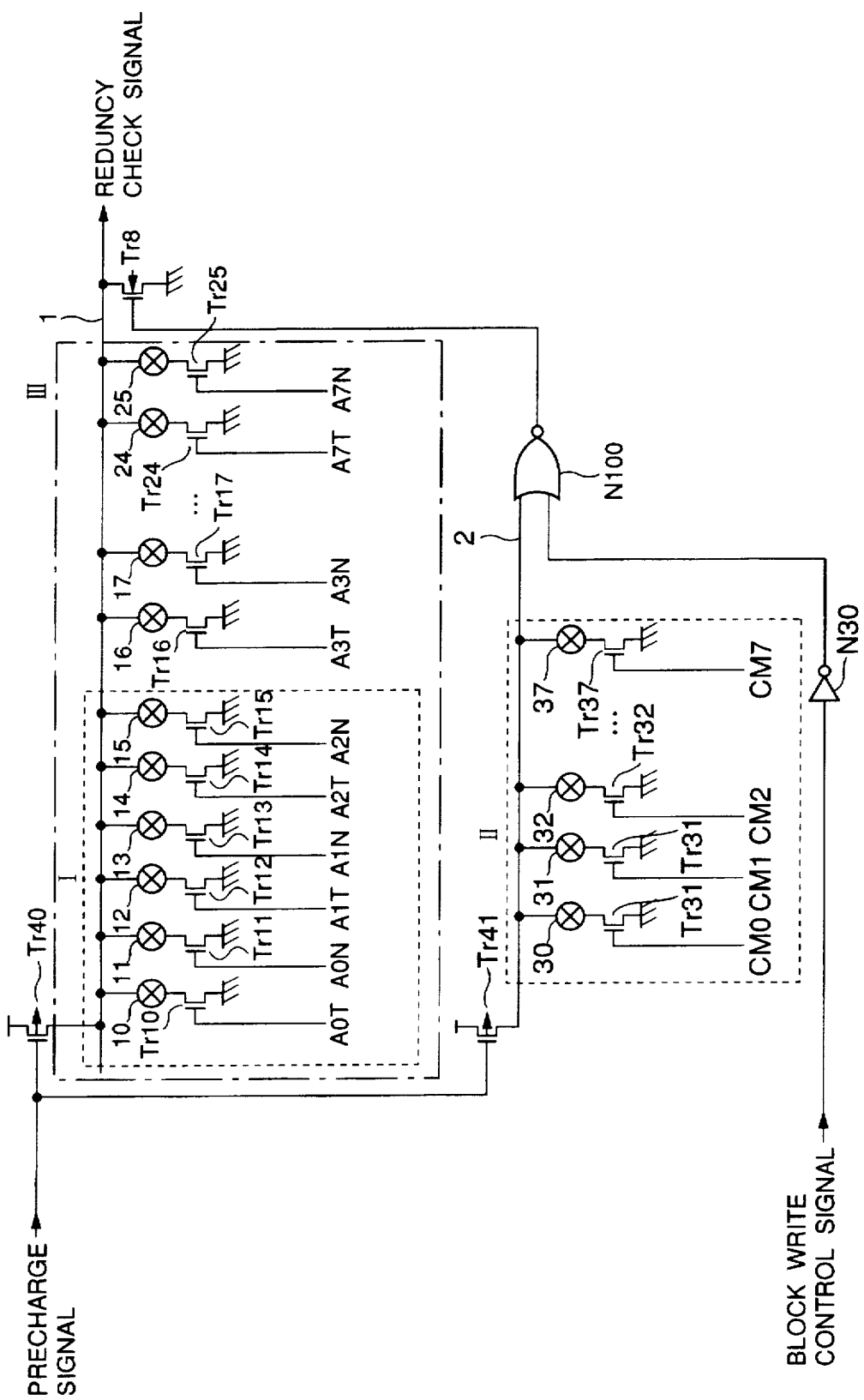

Referring now to FIG. 1, a redundancy circuit according of a memory according to an embodiment of the present invention is constructed for block write operation which executes a write operation on continuous eight columns.

In this embodiment, the continuous eight column addresses are selected by invalidating three bits (A0T/N to A2T/N) of less significant bit or three most least significant bits of column address information.

Before executing the redundancy check, the precharge signal (in the "L" level before the redundancy check) is inputted to the gate of the P-channel transistors (Tr40 and Tr41) to precharge the contacts 1 and 2 to the "H" level. The redundancy check signal connected to the contact 1 is set to the "H" level at the time of redundancy check.

The area 1 indicates the redundancy check circuit for less significant addresses which are invalidated during the block write operation. The area II indicates the redundancy check circuit for block write operation added for column mask check during the block write operation. The node 1 is the redundancy check signal and is set to the "H" level during the redundancy check. The precharge signal is supplied to the gate of the N-channel transistor (Tr8). AiT, AiN (i=0 to 7) are column address signals in which AiT is a positive logic or true level signal, while AiN is a negative logic or complementary level signal.

The N-channel transistors (Tr16 to Tr25) to which the more significant column address signals (A3T/N to A7T/N) are inputted to the gates are connected to GND at one terminal and to the contact 1 via the fuses 16 to 25 at the other terminal. As shown in FIG. 1, the less significant column address signals (A0T/N to A2T/N) are respectively inputted to the NAND circuits NA0 to NA7 and are then decoded as the continuous 8-column addresses Y0 to Y7. CMi (i=0 to 7) is a column mask signal to execute the control so that data is written to the column address designated by the "L" level but data is not written to the column address designated by the "H" level.

While the column mask function is executed, the eight columns are sequentially mask-controlled by the CMi (i=0 to 7) in such a manner that the least significant column among eight columns is mask-controlled by the column mask signal CM0 when it is in the "H" level and the next column is also mask-controlled by the signal CM1.

In an ordinary operation (1 bit write operation), the block write control signal becomes "L" level and the transfer gates T0 to T7 turn ON. Thereafter, less significant addresses A0T/N to A2T/N are fetched and inputted to the inverters N0 to N7 and are then transferred to the contacts S0 to S7. Meanwhile, the transfer gates B0 to B7 are turned OFF and thereby the column mask signal is not fetched. An output of the block write control signal is connected to the transfer gate B0 via the inverter N10 and the transfer gate T0 via the inverter N20. Moreover, while the block write function is executed, the block write control signal becomes "H" level, the transfer gates B0 to B7 turn ON to fetch the column mask signal. This signal is then inputted to the inverters N0 to N7 and is then transferred to the contacts S0 to S7.

On the other hand, the transfer gates T0 to T7 are turned OFF and less significant addresses A0T/N to A2T/N are not fetched. The N-channel transistors (Tr30 to Tr37) to which the less significant addresses are inputted to the gate during the ordinary operation and the column mask signal during the block write operation are connected to the GND at one terminal and to the node 2 via the fuses 30 to 37 at the other terminal. The node 2 is inputted to the gate of the transistor (Tr9) and when the contact 2 is in the "H" level, Tr9 turns ON and the node 1 is turned to the "L" level. The area I cuts the fuses corresponding to the redundancy addresses and the area II cuts the fuses, leaving uncut the fuses corresponding to the redundancy addresses.

In the ordinary operation, since the block write control signal is in the "L" level, the area II inputs the less significant address (A0T/N to A2T/N) signals Y0 to Y7 to the gates of the transistors Tr30 to Tr37 via the inverters N0 to N7. When the fuse connected to Yn (n=0 or 1 or . . . 7) which is selectively turned to the "L" level is cut off as a result that the less significant address signals (A0T/N to A2T/N) are decoded by the NAND circuits NA0 to NA7, the contact 2 becomes the "H" level, Tr9 turns ON, the node 1 is turned to the "L" level and the redundancy YSW is not selected. Moreover, even when only one transistor connected to the fuse not cut off is turned ON in the area I, the node 1 is turned to the "L" level and the redundancy YSW is not selected.

On the contrary, when the fuse connected to Yn (n=0 or 1 or ... 7) which is selectively turned to the "L" level is not cut off as a result that the less significant signals (A0T/N to A2T/N) are decoded by the NAND circuits NA0 to NA7 in the area II, the node 2 is turned to the "L" level and Tr9 turns OFF. Moreover, in the area I, only when the transistors connected to the fuses not cut off are all turned OFF for the more significant addresses, the node 1 is not turned to the "L" level.

As described above, only when the contact 2 is set to the "L" level and the contact 1 is kept at the "H" level, the redundancy YSW is selected.

During a block write operation, since the block write control signal is in the "H" level, the transfer gates T0 to T7 turn OFF, not fetching the column address signal of the lesser significant three bits. However, since the transfer gates B0 to B7 are in the ON state, the column mask signals CMi (i=0 to 7) are fetched. Here, it is assumed, for example, that the fuses 31 to 37 of CM1 to CM7 are all cut off, leaving uncut only the fuse 30 corresponding to CM0. In the redundancy check of the more significant bits AiT, AiN (i=3 to 7), when the node 1 is in the "H" level (namely, the transistors of which fuses are not cut off are all turned OFF in the area I), CM0 does not allow the write operation (the column mask function is executed) and CM0 is the "H" level, Tr30 turns OFF and the node 2 keeps the "H" level. Therefore, since Tr9 turns OFF, the node 1 is turned to the "L" level, the redundancy YSW does not turn ON and write operation to the redundancy column is not executed. In addition, when the CM0 allows the write operation (the column mask function is not executed) and CM0 is in the "L" level, the node 2 is turned to the "L" level. Thereby, since Tr9 turns OFF, the contact 1 keeps the "H" level, the redundancy YSW is selected and write operation is executed to the redundancy column.

There is provided an exclusive fuse corresponding to the result of column mask check. However, according to the present invention, the fuses corresponding to the less significant column addresses and the fuses corresponding to column mask check can be used in common by fetching the less significant column addresses during the ordinary write operation and the column mask check result during the block write operation into the redundancy check circuit. Thereby, chip area can be reduced effectively.

Moreover, the fuse cut computing routine and fuse cut period corresponding to the column mask check result, which has been required in the related art, can be saved during the redundancy P/W.

It is apparent that the present invention is not limited to the above embodiment, but may be modified and changed without departing from the scope and spirit of the invention.

What is claimed is:

1. A semiconductor memory having a function of simultaneously selecting a plurality of columns to perform a write operation on each of selected columns, comprising a redundancy check circuit which includes a set of first fuses corresponding to more significant bits of column address information and a set of second fuses corresponding, in a normal operation, to less significant bits of said column address information and, in a block write operation, to a column mask information, said redundancy check circuit invalidating said less significant bits during said block write operation to output a redundancy check signal in response to a redundancy check result of the more significant bits and a column mask check result.

2. A semiconductor memory having a function to execute a write operation to a single column address among a column addresses inputted and a function to simultaneously select a plurality of column addresses by invalidating a part of the column addresses and selectively executing the write operation to said plurality of column addresses with a mask function, in which a fuse circuit corresponding to column address signals which are invalidated during said plurality of column write operations is used in common to a fuse circuit corresponding to the column mask signals for controlling said mask functions.

3. The memory as claimed in claim 2, wherein the column address signals which are invalidated during the write operation of said plurality of columns are fetched during the write operation of said single column and the column mask signals for controlling said mask function are fetched during said plurality of column write operations.

* * * * *